US012740332B2

(12) United States Patent
Manos, II et al.

(10) Patent No.: US 12,740,332 B2
(45) Date of Patent: Sep. 15, 2026

(54) CARBON FILM INTEGRATED INTO A BACK END OF LINE PROCESS

(71) Applicant: SkyWater Technology Foundry, Inc., Bloomington, MN (US)

(72) Inventors: Peter N. Manos, II, Eden Prairie, MN (US); Vahid Gholizadeh, High Point, NC (US); Philip Thompson, Eden Prairie, MN (US); Mark Nelson, Inver Grove Heights, MN (US); Jeremy Warren, Apple Valley, MN (US)

(73) Assignee: Sky Water Technology Foundry, Inc., Bloomington, MN (US)

( * ) Notice: Subject to any disclaimer, the term of this patent is extended or adjusted under 35 U.S.C. 154(b) by 412 days.

(21) Appl. No.: 18/224,998

(22) Filed: Jul. 21, 2023

(65) Prior Publication Data

US 2025/0031586 A1 Jan. 23, 2025

(51) Int. Cl.

| | |
|---|---|
| ***H10B 63/00*** | (2023.01) |
| ***H10K 10/46*** | (2023.01) |
| ***H10N 70/00*** | (2023.01) |

(52) U.S. Cl.

CPC .......... *H10N 70/026* (2023.02); *H10B 63/34* (2023.02); *H10K 10/462* (2023.02); *H10N 70/063* (2023.02); *H10N 70/8845* (2023.02)

(58) Field of Classification Search

CPC ............... H10N 70/026; H10N 70/063; H10N 70/8845; H10B 63/34; H10K 10/462

See application file for complete search history.

(56) References Cited

U.S. PATENT DOCUMENTS

| | | | |
|---|---|---|---|
| 6,787,200 B1 * | 9/2004 | Delaunay .......... | H01J 37/32678 423/445 B |
| 7,615,439 B1 | 11/2009 | Schricker et al. | |
| 7,977,761 B2 | 7/2011 | Kabir | |

(Continued)

FOREIGN PATENT DOCUMENTS

| | | |
|---|---|---|
| CN | 106809825 A * | 6/2017 |
| EP | 1945840 B1 | 3/2017 |
| JP | 2009157181 A * | 7/2009 |

OTHER PUBLICATIONS

Bagley, Jacob D., et al., "Exploring Sputtered Carbon for the Nanofuses in Solid-State Long-Term Digital Data Storage", International Symposium on Optical Memory ISOM, (Oct. 2014), 3 pages.

(Continued)

*Primary Examiner* — Samuel Park

(74) *Attorney, Agent, or Firm* — Schwegman Lundberg & Woessner, P.A.

(57) ABSTRACT

A variety of applications can include an electronic device having a carbon nano-film. The carbon nano-film can be implemented as different types of components in electronic devices, depending on the application and structure of the electronic device in which the carbon nano-film is constructed. Fabrication of the carbon nano-film can include depositing, by physical vapor deposition, a carbon film on a surface of a layer formed in a back end of line of complementary metal-oxide semiconductor processing of the electronic device. The carbon nano-film can be constructed as a carbon nano-fuse. Such a carbon nano-fuse can be used as a permanent data storage element in memory cells of a memory device.

17 Claims, 18 Drawing Sheets

(56) References Cited

U.S. PATENT DOCUMENTS

| | | | | |
|---|---|---|---|---|
| 8,014,185 | B2 | 9/2011 | Scheuerlein | |
| 8,716,805 | B2 | 5/2014 | Fujita | |
| 10,170,304 | B1 | 1/2019 | Kwon et al. | |
| 2006/0258122 | A1 * | 11/2006 | Whitefield | H01L 23/5258 438/467 |
| 2009/0061329 | A1 * | 3/2009 | Hirota | H01L 21/02115 430/5 |
| 2009/0218600 | A1 | 9/2009 | Park et al. | |
| 2010/0013045 | A1 * | 1/2010 | Weeks | H01L 23/5256 257/E23.149 |
| 2015/0236026 | A1 | 8/2015 | Lunt et al. | |
| 2022/0162742 | A1 | 5/2022 | Ohba et al. | |

OTHER PUBLICATIONS

Brown, Ian G, "Cathodic Arc Deposition of Films", Annu. Rev. Mater. Sci. 28:243-69, (1998), 27 pgs.

Dimitriadis, C. A., et al., "Microstructure and its effect on the conductivity of magnetron sputtered carbon thin films", Journal of Applied Physics 89, (Jun. 15, 2001), 7 pages.

Laughlin, Kevin Robert, et al., "Preparation and Properties of Carbon Nanofuses for Permanent Data Storage", International Symposium on Optical Memory ISOM, (Oct. 2014), 3 pages.

Laughlin, Kevin, et al., "Preparation and Properties of Carbon Nanofuses for Permanent Data Storage", Research Gate, (Oct. 2014), 3 pgs.

Laughlin, Kevin Robert, et al., "Thin Film Carbon Nanofuses for Permanent Data Storage", Brigham Young University BYU Scholars Archive, (Apr. 1, 2018), 41 pgs.

Laughlin, Kevin R, et al., "Thin-Film Carbon Nanofuses for Permanent Data Storage", ACS Omega 2017, 2, 2432-2438, (2017), 7 pgs.

Microchemicals, "Basics of Microstructuring Lift off Processes with Photoresist", [Online]. Retrieved from the Internet: <http://www.microchemicals.com/downloads/application_notes.html>, (Jun. 12, 2018), 6 pages.

Pearson, A. C., et al., "Oxidation of graphene bow tie nanofuses for permanent write once read many data storage devices", Nanotechnology 24, (Mar. 12, 2013), 8 pages.

Pearson, Anthony C., et al., "Materials Study of Nanoscale Fuses for Solid State Data Storage", International Symposium on Optical Memory ISOM, (Sep. 2012), 3 pages.

Wang, Hao, et al., "Development of an Optical Model guided by AFM for Arc Deposited Carbon Thin Films in Solid State Data Storage Elements", International Symposium on Optical Memory ISOM, (Oct. 2014), 3 pages.

Wang, Hao, et al., "Exploring Sputtered Carbon for the Nanofuses in Solid-State Long-Term Digital Data Storage", Research Gate, 3 pgs.

Zhao, Weisheng, et al., "Functional Model of Carbon Nanotube Programmable Resistors for Hybrid Nano/CMOS Circuit Design", Nano Net 4th International ICST Conference Nano Net 2009 Lucerne Switzerland, (Oct. 2009), 6 pages.

Zhao, Weisheng, et al., "Functional Model of Carbon Nanotube Programmable Resistors for Hybrid Nano/CMOS Circuit Design", Institute for Computer Science, Social-Informatics and Telecommunications Engineering, (2009), 6 pgs.

* cited by examiner

CARBON FILM INTEGRATED INTO A BACK END OF LINE PROCESS

FIELD OF THE DISCLOSURE

Embodiments of the disclosure relate generally to electronic devices and, more specifically, to devices containing a carbon film and methods of formation thereof.

BACKGROUND

Memory devices are typically provided as internal, semiconductor, integrated circuits (ICs) in computers or other electronic devices in a variety of manufactured products. There are many different types of memory, including volatile and non-volatile memory. Volatile memory requires power to maintain its data, and examples of volatile memory include random-access memory (RAM), dynamic random-access memory (DRAM), static RAM (SRAM), and synchronous dynamic random-access memory (SDRAM), among others. Non-volatile memory can retain stored data when not powered, and examples of non-volatile memory include flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), and three-dimensional (3D) XPoint™ memory, among others.

Some memories can be implemented as write-once-read-many memory (WORM) devices, which can provide permanent data storage devices in many applications. Operation and properties of memory devices and other electronic devices in systems can be improved by enhancements to the procedures and design of these electronic devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
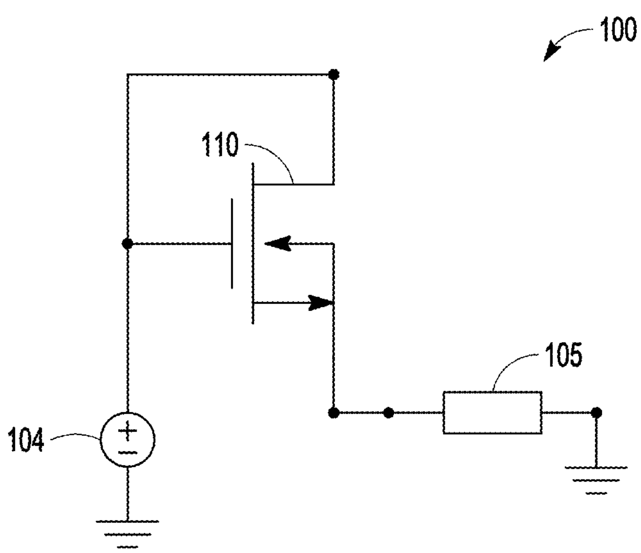
FIG. 1 illustrates an arrangement of a high voltage n-channel metal-oxide-semiconductor field effect transistor with a carbon nanofuse for a read operation, according to various embodiments.

The following detailed description refers to the accompanying drawings that show, by way of illustration and not limitation, various embodiments in which an invention can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid state device (SSD), an MultiMediaCard (MMC) device, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

In various embodiments, a carbon film can be formed integrated into a complementary metal-oxide semiconductor (CMOS) back end of line (BEOL) processing. The carbon film can be a nano-carbon structure. The nano-carbon structure can be a carbon nanofuse (CNF) formed in a number of different electronic devices. Fabrication of the CNF can include making the CNF as a one-time programmable memory cell, which is fully integrable within conventional CMOS processing, using only BEOL-compatible procedures. BEOL is a portion of an IC fabrication process that is directed to interconnecting individual devices of the IC with conductive paths such as, but not limited to, conductive traces or wires. The conductive traces or wires can include metals such as, but not limited to, copper, aluminum, ruthenium, or tungsten. The temperatures used in BEOL-compatible procedures can be substantially lower than temperatures used in constructing active devices of an IC in front end of line (FEOL) processing.

Forming a CNF as a one-time programmable memory cell can be integrated within a legacy process. A symmetrical high voltage (HV) n-channel metal-oxide-semiconductor field effect transistor (NMOS FET), which can be referred to as a NMOS transistor, can be used as a read and a write device. A single NMOS transistor can be arranged as an access transistor to the CNF structured as the storage component of the memory cell. The NMOS transistor can be implemented as an insulated gate field-effect transistor (IG- FET), which is not limited to a metal gate for the gate of the IGFET or to silicon oxide for the gate dielectric of the IGFET. The HV NMOS transistor can have a device size, defined by the width/length (W/L) ratio of the transistor channel, of approximately 1.0/0.35 as a reference device. Other W/L ratios can be used, where the exact W/L ratio can depend on the programming conditions to be implemented.

The HV NMOS access transistor can be used to pass current through the fuse to ground or another reference node. The fuse access event is primarily voltage driven, which uses a voltage between 3.5V-4.5V, for example, to effectively write the device. An intact fuse (pre-blown fuse) can be read as a "1" and draws current in read mode. A blown fuse can then be read as a "0" and can draw almost zero current, for example, at least 3 orders of magnitude lower than an intact fuse.

FIG. 1 illustrates an embodiment of an example arrangement 100 of a HV NMOS 110 with a CNF 105 for a read operation. CNF 105, which has a resistance and can be viewed as a resistor that can be placed in one of two states, is connected to the source of HV NMOS 110. With a read voltage applied to the gate and drain of HV NMOS 110 by a voltage source 104, if CNF 105 is intact, HV NMOS 110 passes current and the memory, defined by arrangement 100, reads as a "1." If CNF 105 is blown, HV NMOS 110 passes no current and the memory reads as a "0." The difference in current between a "0" and a "1" can be at least three orders of magnitude, based on data from tests. Simulations, for HV NMOS 110 having w/l=1/0.35, have indicated that a 2V read voltage drops approximately 1V across each of HV NMOS 110 and CNF 105. The read current is approximately 40 uA. The read operation can be performed with CNF 105 on either the high or the low side of HV NMOS 110, but a larger current draw occurs with CNF 105 on the low side.

Figure 2:
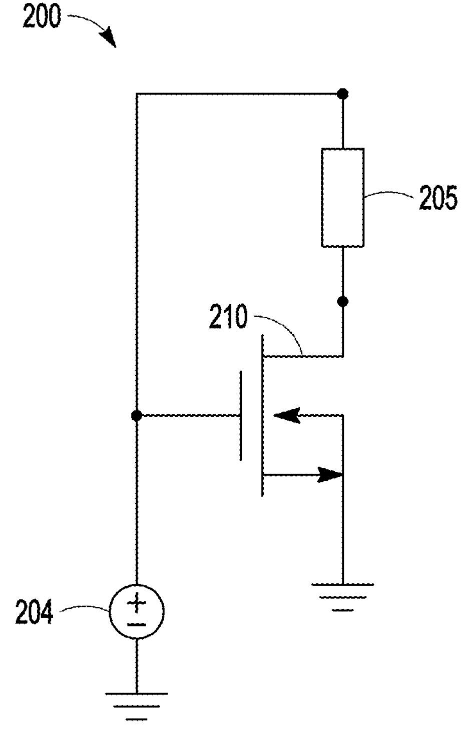
FIG. 2 illustrates an arrangement of a high voltage n-channel metal-oxide-semiconductor field effect transistor with a carbon nanofuse for a write operation, according to various embodiments.

FIG. 2 illustrates an embodiment of an example arrangement 200 of a HV NMOS 210 with a CNF 205 for a write operation. The source of HV NMOS 210 is grounded, and up to 6V can be applied by voltage source 204 to the drain side, where the applied voltage can be pulsed. The voltage drop across HV NMOS 210 is approximately 1V and the rest of the voltage appears across CNF 205, applying enough energy to blow CNF 205. If CNF 205 is put on the source side during the write operation, the source-body voltage rises to around half of the applied drain voltage (approximately 3V), reducing the effective voltage across CNF 205 and making it harder to program.

In a memory array having data lines (BLs) and source lines (SLs), the BL on the drain side of the HV NMOS of a memory cell having a CNF as a data storage element and the SL on the source side of the HV NMOS are independent and neither of them is set to chip ground. This configuration enables read circuitry and write circuitry to occupy different physical spaces on the chip (die), since the write circuitry is tied to the drain terminal and the read circuitry is tied to the source terminal of the HV NMOS of the memory element.

Once a CNF is blown, it does not grow back. The "blowing" operation uses oxidation of the carbon. Oxidation of the carbon can be to CO that volatilizes, leaving nothing to grow back. The CO is non-conductive and does not provide a path for conduction of current. This has been proven out by data retention studies.

Figure 3:
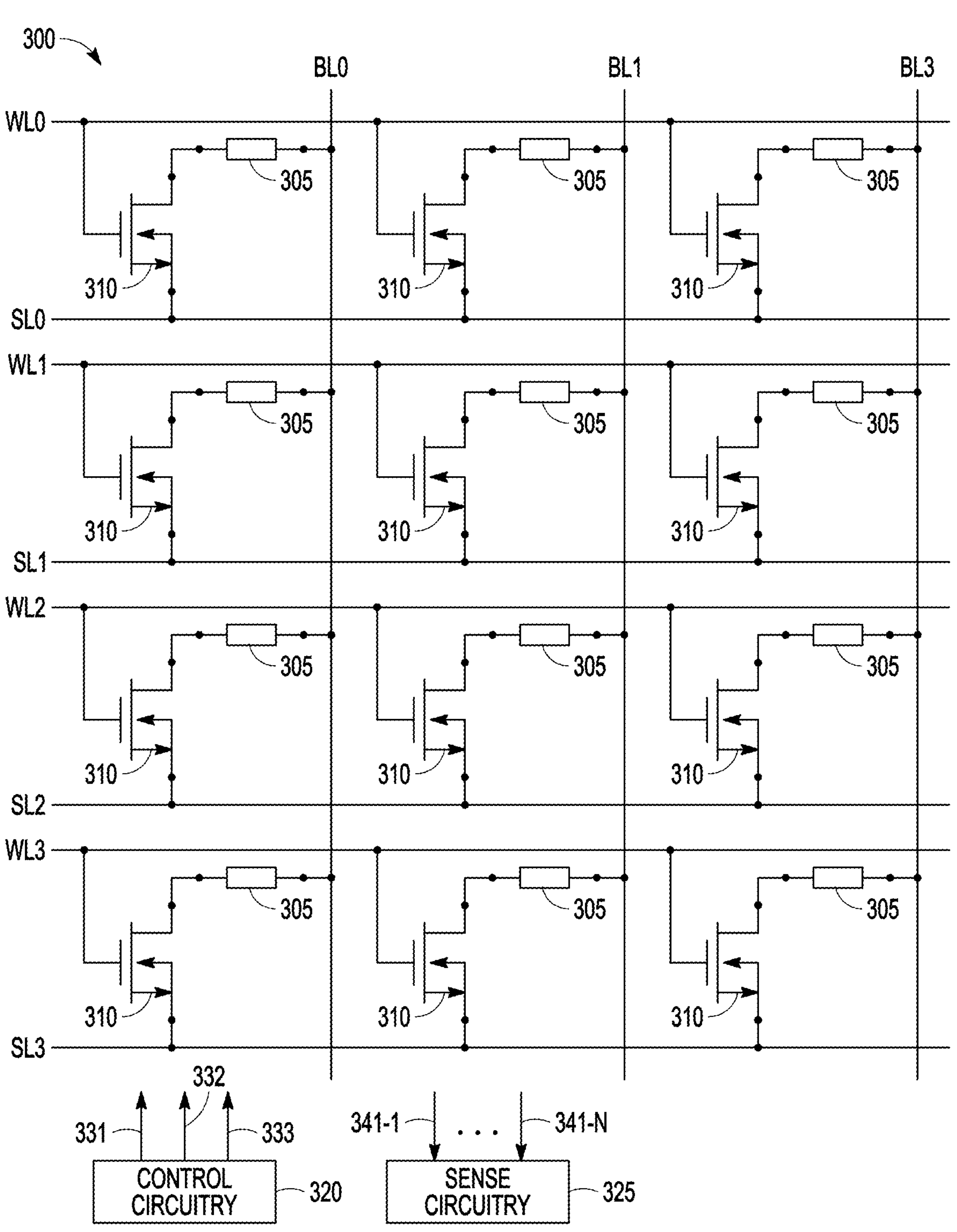
FIG. 3 illustrates features of an example memory device having an array of memory cells where each memory cell includes a carbon nanofuse coupled to an access transistor, according to various embodiments.

FIG. 3 illustrates features of an embodiment of an example memory device 300 having an array of memory cells, where each memory cell includes a CNF 305 coupled to an access transistor 310. Access transistor 310 is, but is not limited to, a HV NMOS. Memory device 300 also includes access lines WL0, WL1, WL2, and WL3, source lines SL0, SL1, SL2, and SL3, and data lines BL0, BL1, and BL3. Though four access lines, four source lines, and three data lines are shown, memory device 300 can have more or fewer access lines, source lines, and data lines. In a write operation, source lines SL0, SL1, SL2, and SL3 can be set to ground, and a select data line of BL0, BL1, and BL3 can be pulled high with a corresponding access line WL set high such as, but not limited to, 5.0 V. In a read operation, data lines BL0, BL1, and BL3 can be set to ground, and a select data line of SL0, SL1, SL2, and SL3 can be pulled high with a corresponding access line WL set high such as, but is not limited to, 1.2 V. Memory device 300 can include control circuitry 320 having lines 331, 332, and 333 to control the access lines, source lines, and data lines of memory device 300 and sense circuitry 325 having lines 341-1, . . . 341-N to evaluate the data stored. Though a memory cell can store data as a zero when CNF 105 is blown and a one when CNF 105 is not blown, sense circuitry 325 can be constructed to evaluate a blown CNF 105 as a one and a non-blown CNF 105 as a zero.

Carbon can be fabricated as a nano-thickness film in other electronic devices. For instance, a carbon nano-film can be constructed as a resistor, a gate of an IGFET with possible improvements over its breakdown voltage, a trimmable element in analog designs, or other appropriate structures.

Figures 4, 5:
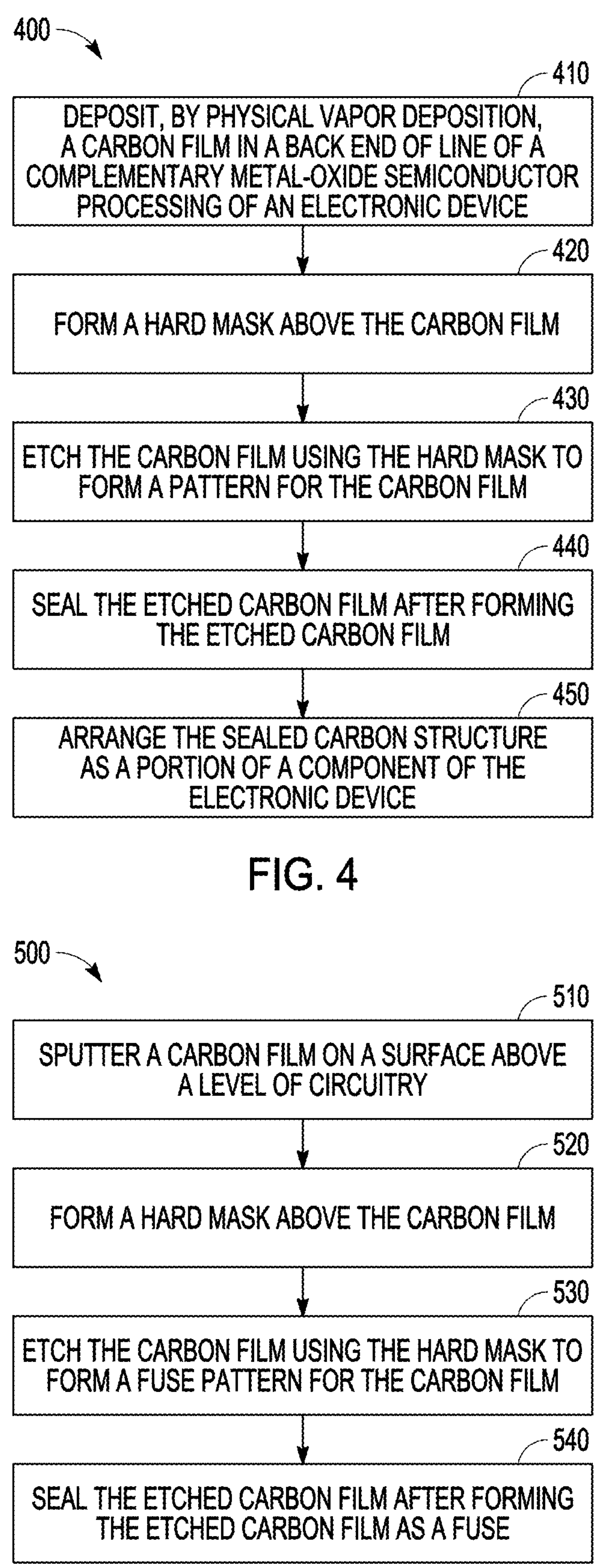
FIG. 4 is a flow diagram of features of an example method of forming an electronic device, according to various embodiments.
FIG. 5 is a flow diagram of features of another example method of forming an electronic device, according to various embodiments.

FIG. 4 is a flow diagram of features of an embodiment of an example method 400 of forming an electronic device. At 410, a carbon film is deposited by physical vapor deposition (PVD) on a surface of a layer formed in a BEOL CMOS processing of the electronic device. PVD is a vacuum-based method that includes vaporization from a source of the material to be deposited, transportation of the material freed from the source, and nucleation and development of films. Sputtering, electron beam evaporation, pulsed laser deposition, and vacuum arc methods are common techniques utilized in PVD processing. Other deposition processes for carbon can be used, including, but not limited to, atomic layer deposition (ALD).

At 420, a hard mask is formed above the carbon film. A hard mask is a material used in electronic device processing as a mask to be used in etching, where the material is a resist material that is more effective than polymer or other organic materials that are considered to be soft resist material. Hard mask materials can be metal or dielectric. Typically, use of a hard mask involves an additional deposition process. The hard mask material is deposited and etched into a desired pattern using a standard photoresist process for the hard mask material. After processing the material protected using the hard mask, the hard mask can be removed with a further etching process appropriate for the material of the hard mask.

At 430, the carbon film is etched using the hard mask to form a pattern for the carbon film. At 440, after forming the etched carbon film, the etched carbon film is sealed, forming a sealed carbon structure. At 450, the sealed carbon structure is arranged as a portion of a component of the electronic device. The sealed carbon structure can be realized as a number of different components, depending on the architecture of the electronic device, such as a fuse, a resistor, or a gate of an IGFET, or other component of the electronic device.

Variations of method 400 or methods similar to method 400 can include a number of different embodiments that may be combined depending on the application of such methods and/or the architecture of systems including an electronic device for which such methods are implemented. Such variations can include performing the PVD at temperatures substantially lower than processing temperatures used in forming circuitry to which the carbon film is to be coupled. The temperature of processing the carbon film in the BEOL processing can be at a percentage of the temperature for the FEOL processing. The processing of the carbon film can be at sixty-five percent or less than the temperature of the FEOL processing. The processing of the carbon film can be at 400° C. or less. Such variations can include forming a dielectric on the carbon film as a protective layer in forming the sealed carbon structure. The portions of the dielectric on the carbon film can be maintained in the electronic device in completed format.

FIG. 5 is a flow diagram of features of an embodiment of an example method 500 of forming an electronic device. At 510, a carbon film is sputtered on a surface above a level of circuitry after forming the circuitry and vias between the surface and the level of circuitry. At 520, a hard mask is formed above the carbon film. At 530, the carbon film is etched using the hard mask to form a fuse pattern for the carbon film. At 540, the etched carbon film is sealed after forming the etched carbon film as a fuse.

Variations of method 500 or methods similar to method 500 can include a number of different embodiments that may be combined depending on the application of such methods and/or the architecture of systems including an electronic device for which such methods are implemented. Such variations can include annealing the sputtered carbon film at a temperature and for a time until resistance of the carbon film is within a specified range of resistance values.

Such variations can include sputtering the carbon film on a conductive landing formed on two vias of the vias formed between the surface from the level of circuitry. The conductive landing can include titanium nitride or titanium tungsten and the two vias can include tungsten. Variations can include forming the hard mask to a thickness correlated to thickness of the sputtered carbon film.

Such variations can include forming an etch stop on the carbon film on which the hard mask is formed. The etch stop can be formed by depositing a silicon nitride, where the hard mask can include an oxide. Etching the carbon film using the hard mask can include forming a patterned photoresist above the hard mask and etching the hard mask. The patterned photoresist above the hard mask can be formed by forming a bottom anti-reflective coating (BARC) on and contacting the hard mask and spinning the photoresist on the BARC. The spun-on photoresist can be subjected to a heat treatment to bake the photoresist. The photoresist can be developed.

Variations of method 500 or methods similar to method 500 can include forming a dielectric spacer along a vertical side of the etched carbon film when sealing the etched carbon film. Variations can include etching the carbon film using the hard mask to form a fuse pattern in a procedure forming a pattern of array of fuses, with each fuse contacting two vias between the surface and the level of circuitry. Variations can include structuring the circuitry with components to operate the fuse as a permanent data component.

Figure 6:
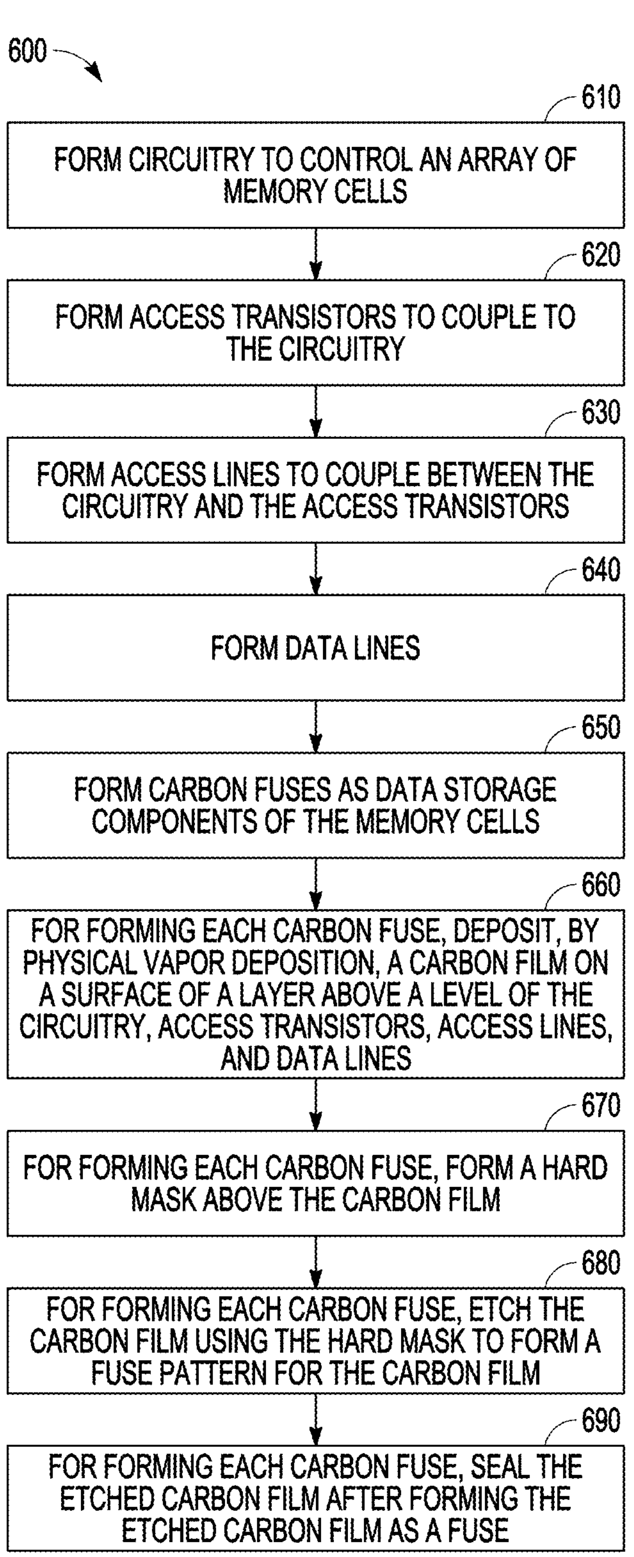
FIG. 6 is a flow diagram of features of an example method of forming a write-once-read-many memory device according to various embodiments.

FIG. 6 is a flow diagram of features of an embodiment of an example method 600 of forming a WORM device. At 610, circuitry to control an array of memory cells is formed. At 620, access transistors to couple to the circuitry are formed. At 630, access lines to couple between the circuitry and the access transistors are formed. At 640, data lines are formed. At 650, carbon fuses are formed as data storage components of the memory cells, where each carbon fuse can be formed in the same manner. Each carbon fuse can be formed simultaneously.

At 660, to form each carbon fuse, a carbon film is deposited by physical vapor deposition on a surface of a layer above a level of the circuitry, access transistors, access lines, and data lines after forming vias between the surface and the level of the circuitry, access transistors, access lines, and data lines. At 670, to form each carbon fuse, a hard mask is formed above the carbon film. At 680, to form each carbon fuse, the carbon film is etched using the hard mask to form a fuse pattern for the carbon film. At 690, to form each carbon fuse, the etched carbon film is sealed after forming the etched carbon film as a fuse.

Variations of method 600 or methods similar to method 600 can include a number of different embodiments that may be combined depending on the application of such methods and/or the architecture of systems including a WORM device for which such methods are implemented. Such variations can include PVD depositing the carbon film by sputtering the carbon film. Variations can include sputtering the carbon film on a conductive landing formed on two vias of the vias formed between the surface from the level of circuitry. Variations can include forming an etch stop on the carbon film on which the hard mask is formed.

Features of each of methods 400, 500, and 600 can be formed in an order appropriate for a selected manner of fabrication. Features of any one of the methods 400, 500, and 600 can be used be used in others of the methods 400, 500, and 600.

Figure 7:
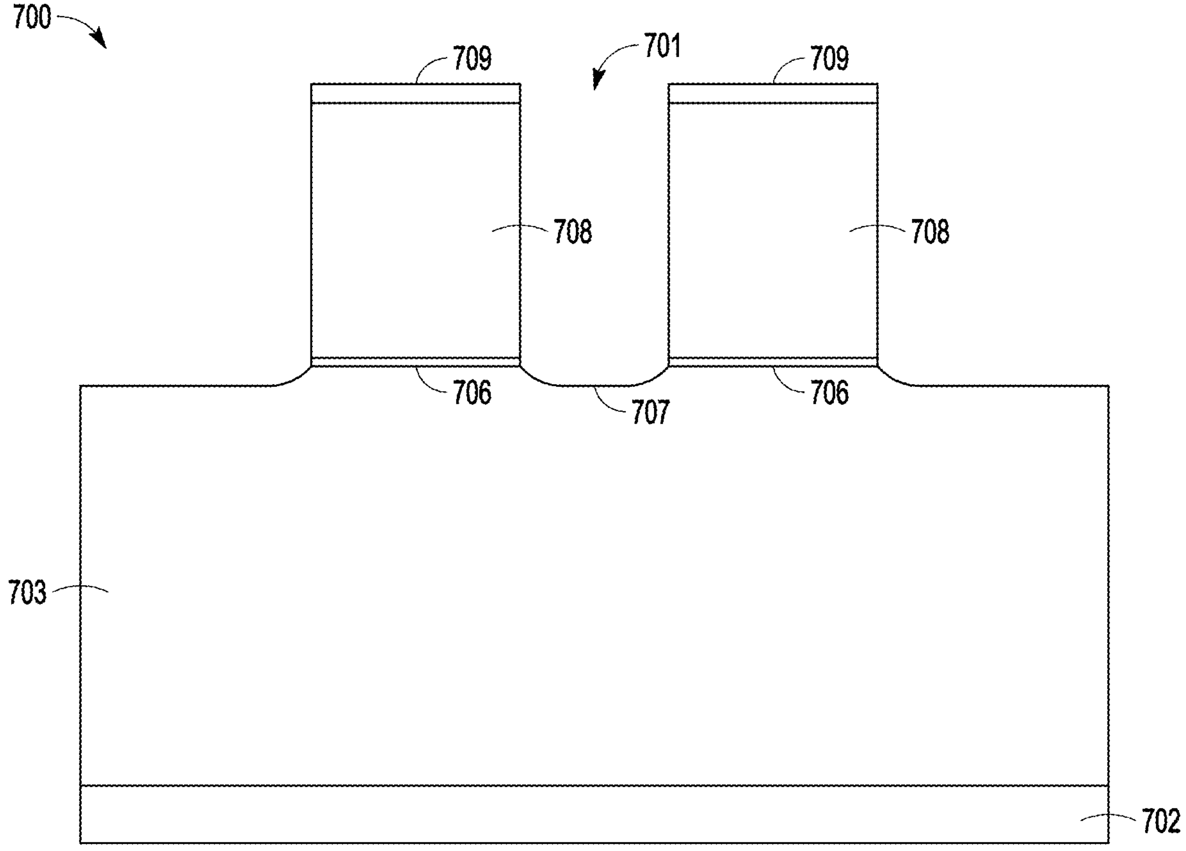
FIGS. 7-27 illustrate procedures related to an example method of fabricating a carbon nanofuse integrated within a complementary metal-oxide semiconductor process flow of an electronic device, according to various embodiments.

FIGS. 7-27 illustrate procedures related to an embodiment of an example method of fabricating a CNF integrated within a CMOS flow of an electronic device. FIG. 7 illustrates a cross-section of a structure 700 from a process flow after patterning and etching of top metal in a BEOL of the process flow of a portion of the electronic device being fabricated. Structure 700 has been formed after using and removing a photoresist mask layer. In this example, a dielectric 703 has been formed on a substrate 702 having previously formed metal layers. Substrate 702 can be, but is not limited to, a p-type bulk Si substrate 702 having previously formed metal layers. Dielectric 703 can be an oxide such as, but not limited to, tetraethoxysilane (TEOS). Deposited dielectric 703 can have, but is not limited to, a vertical thickness of 7000 Å±700 Å above substrate 702. The vertical thickness can be selected depending on the electronic device being formed. A titanium underlayer 706 has been formed on dielectric 703. Titanium underlayer 706 can be formed having a thickness of 150 Å±30 Å. Metal regions 708 have been formed and separated by an interval 701 with a gouge region 707 into dielectric 703. Metal regions 708 can be, but are not limited to, aluminum. Metal regions 708 can have a vertical thickness of 4230 Å±800 Å. Capping regions 709 have been formed on metal regions 708. Capping regions 709 can be titanium tungsten (TiW) capping regions. The vertical thickness of capping region 709 can have a thickness of 300 Å±30 Å. The metals, the dielectrics, and the thicknesses of structure 700 are not limited to the metals, the dielectrics, and the thicknesses discussed above.

Figure 8:
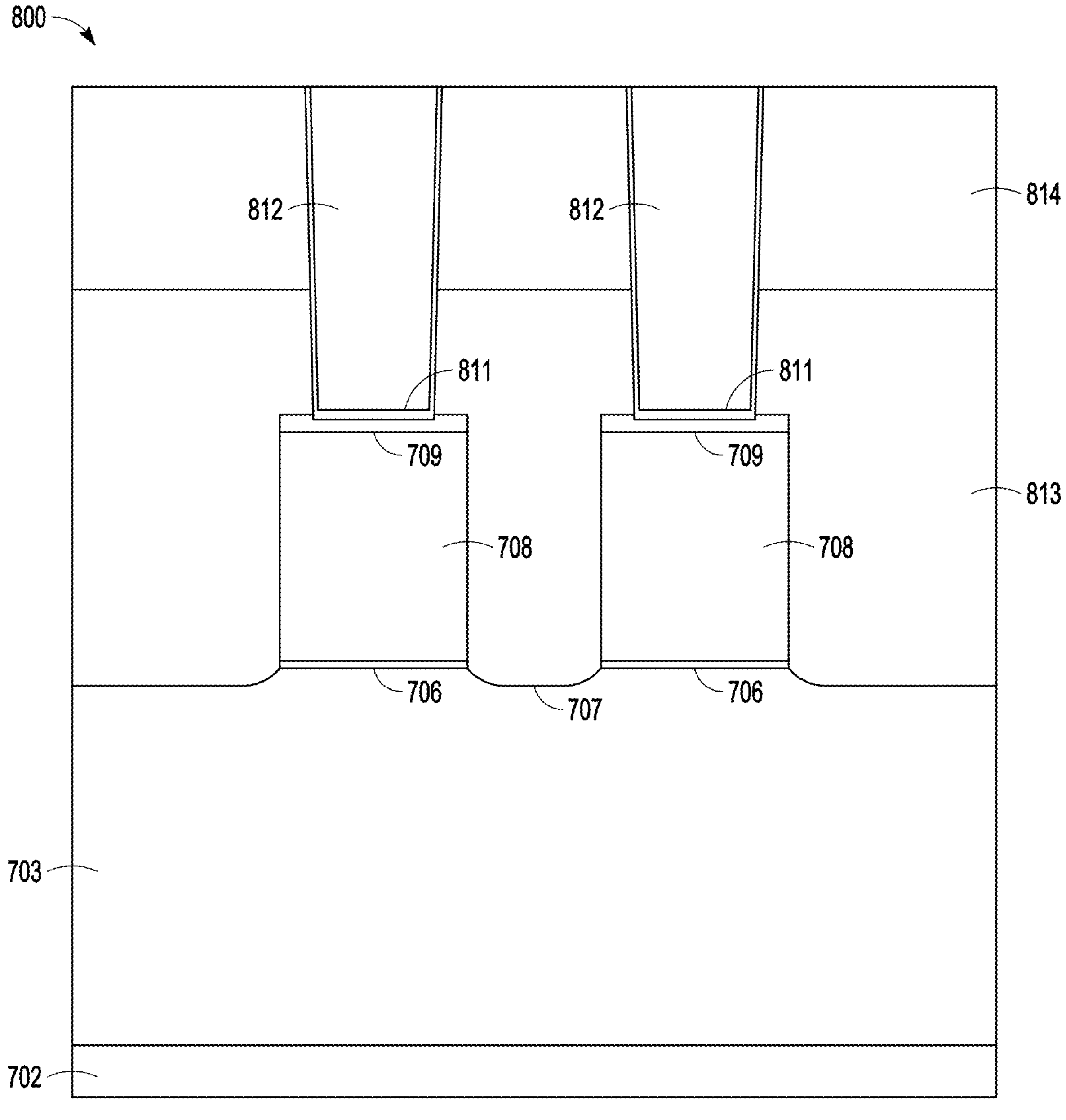

FIG. 8 is a cross-sectional representation of structure 800 after further processing of structure 700. Another photoresist mask layer has been used to pattern and etch material to form vias 812. Vias 812 can be formed as conductive vias. These conductive vias can include tungsten. Via bottom regions 811 have been formed on capping regions 709 from over etching capping regions 709. Vias 812 have been formed extending vertically from via bottom regions 811. A dielectric region 813 has been formed on dielectric 703 and around portions of vias 812, removing interval 701. Dielectric region 813 can have a thickness of 2300 Å±1350 Å. Dielectric region 813 can be formed of the same material as dielectric 703. A dielectric region 814 has been formed on dielectric region 813 and around the remaining portions of vias 812 above dielectric region 813. Dielectric region 814 can have a thickness of 3750 Å±76 Å. Dielectric region 814 can be formed of the same material as dielectric region 813. The metals, the dielectrics, and the thicknesses of structure 800 are not limited to the metals, the dielectrics, and the thicknesses discussed above.

Figure 9:
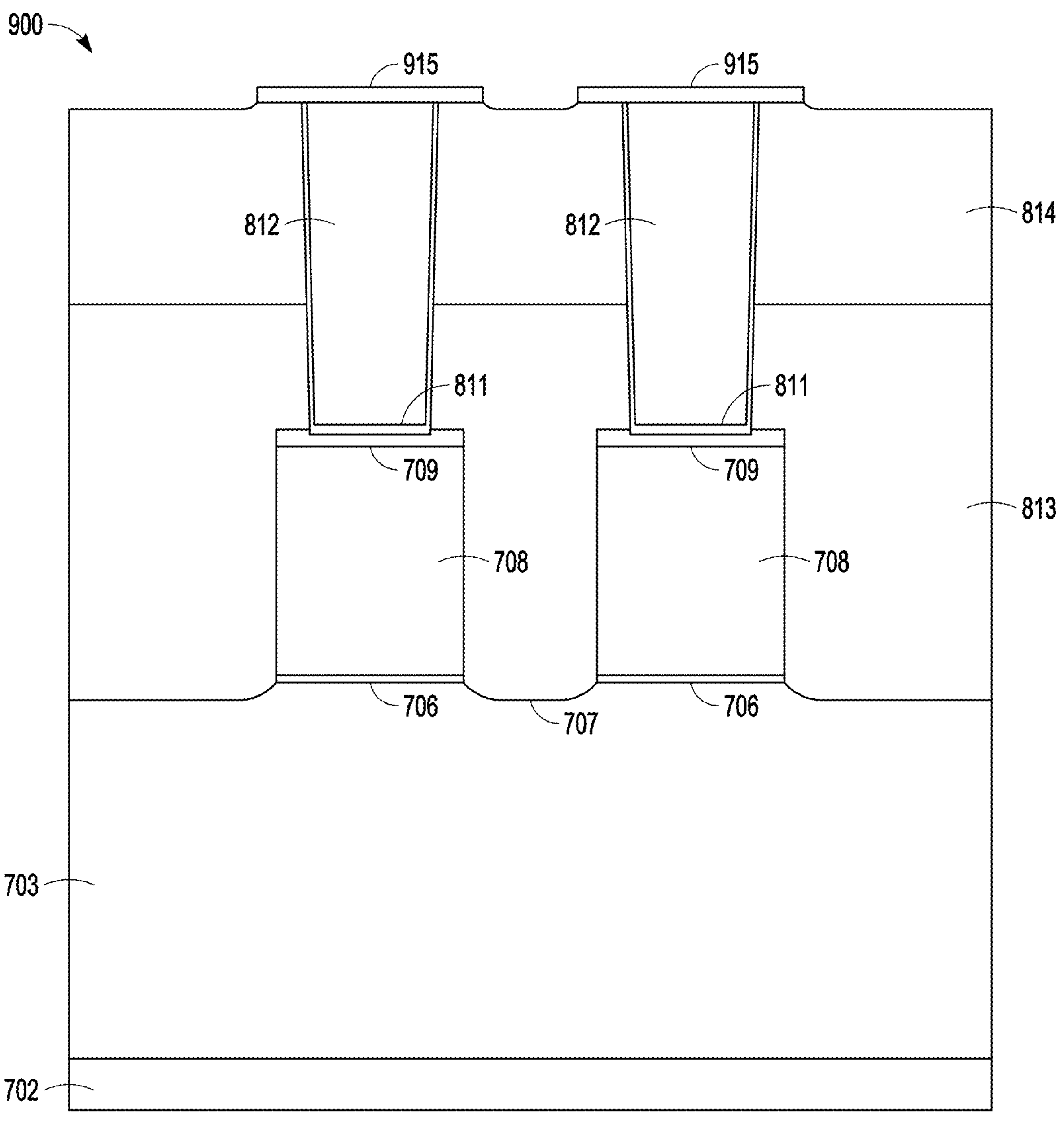

FIG. 9 is a cross-sectional representation of structure 900 after further processing of structure 800. Optional titanium nitride metals have been deposited and patterned by a third mask to act as landing metal 915 for a carbon fuse to be formed. Titanium nitride metal can be used to reduce the contact resistance between vias 812 and the carbon film to be deposited above and electrically coupled to vias 812. Other metals or other conductive materials can be used for landing metal 915 or other conductive materials that can reduce contact resistance and are appropriate for the process flow. FIG. 9 represents completion of preceding steps including CMOS circuitry, metal lines, and vias to reside under a CNF to be formed.

Figure 10:
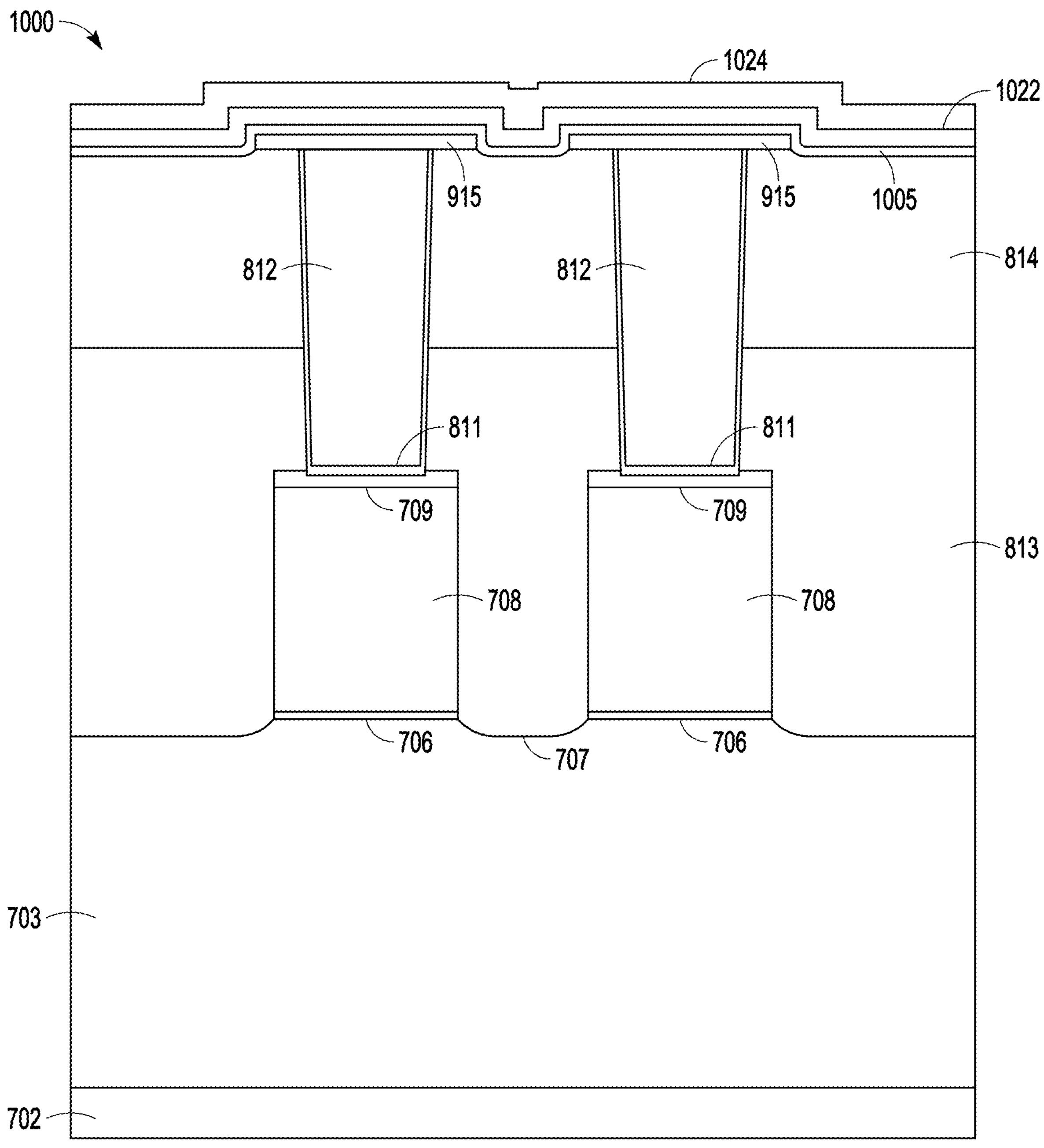

FIG. 10 is a cross-sectional representation of structure 1000 after further processing of structure 900. A carbon thin film 1005 has been sputtered on landing metal 915 or directly on vias 812, if landing metal 915 is not deposited, and on dielectric region 814. The sputtered carbon thin film can be sputtered and processed to a thickness in the range of 100-300 Å, 50-500 Å, or other range for a CNF. Sputtered carbon thin film 1005 has been annealed. Carbon thin film 1005 can be annealed at a temperature between 400-500° C. The annealing temperature and time can be used to reduce the resistance of carbon thin film 1005 to targeted values. An etch stop 1022 has been deposited on carbon thin film 1005. Etch stop 1022 provides protection of carbon thin film 1005 from oxidation and from attack by a photoresist mask strip implemented in further processing. Etch stop 1022 can be a deposited silicon nitride region and can be deposited to a thickness of, but not limited to, 200 Å. Etch stop 1022 can be formed by a PVD technique.

A hard mask 1024 has been formed on etch stop 1022. Hard mask 1024 can be, but is not limited to, a silicon dioxide ($SiO_2$) hard mask. Hard mask 1024 can be used to pattern and etch carbon thin film 1005 and provide for safe strip of a photoresist mask in later processing. Hard mask 1024 can be deposited, but is not limited to, a thickness of about 550 Å. Deposition of hard mask 1024 can be TEOS or silane ($SiH_4$) based, and hard mask 1024 can be formed by a PVD technique.

Figure 11:
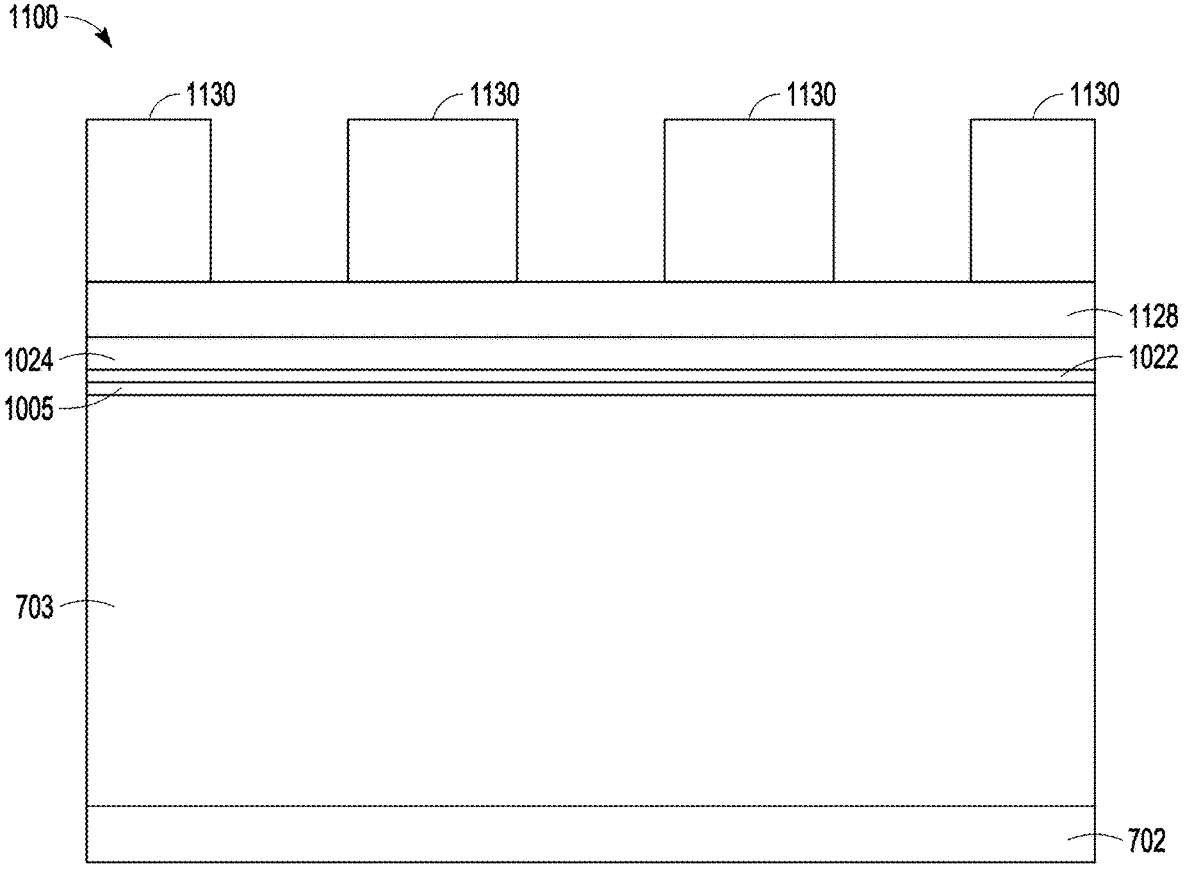

FIG. 11 is a cross-sectional representation of structure 1100 after further processing of structure 1000. A BARC layer 1128 has been deposited. BARC layer 1128 can be deposited to, but is not limited to, a thickness of about 950 Å. A photoresist 1130 has been patterned to allow for etching of carbon thin film 1005 later in the processing. Photoresist 1130 can be spun on, baked, and developed. The etch recipe can be developed and optimized to allow for safely etching carbon thin film 1005 into a CNF, a resistor, or other structure.

Figure 12:
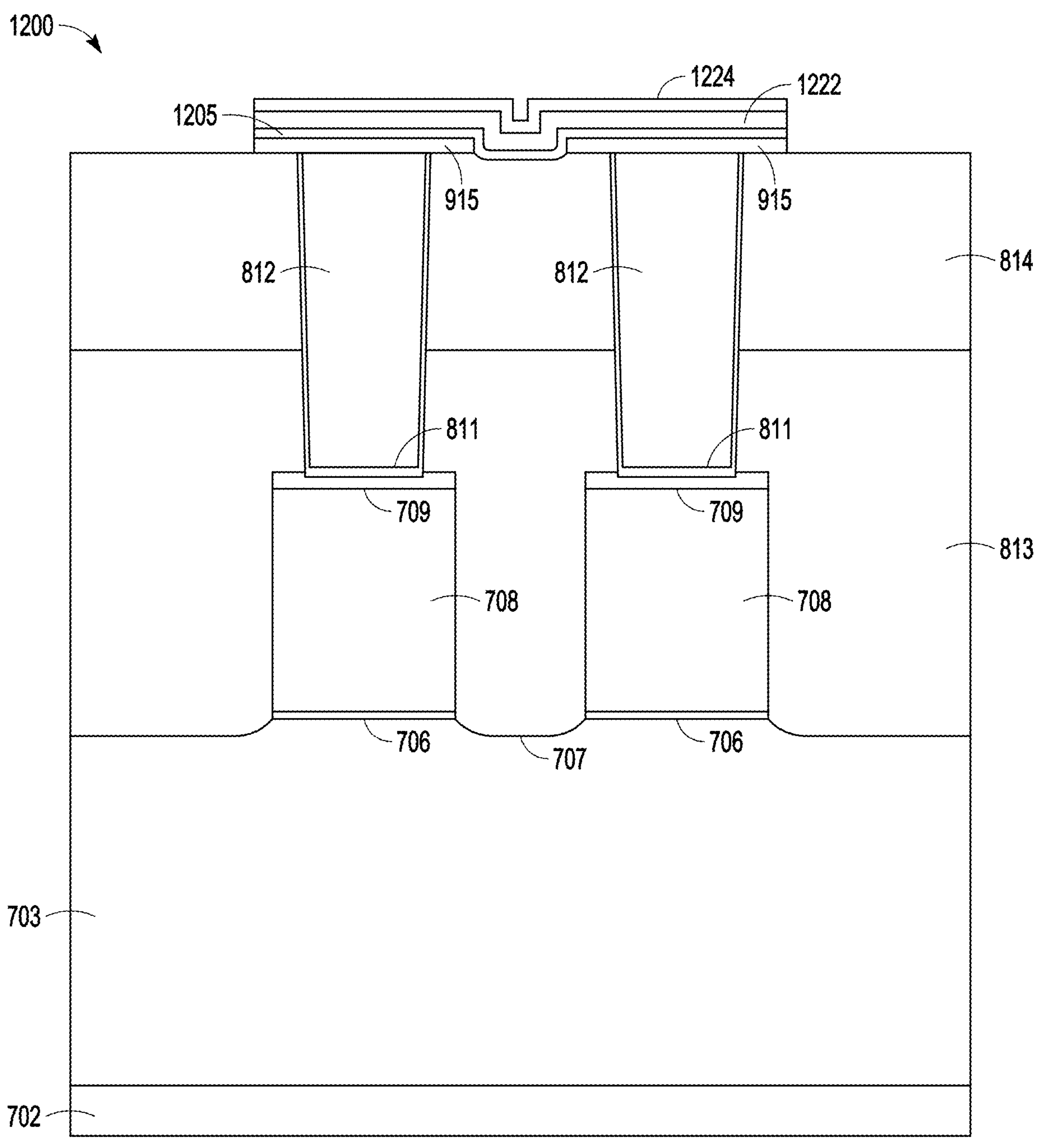

FIG. 12 is a cross-sectional representation of structure 1200 after further processing of structure 1100. BARC layer 1128 has been etched and removed and hard mask 1024 has been etched, reducing hard mask 1024 to hard mask 1224, followed by a strip of photoresist 1130. These procedures have exposed a top surface of dielectric region 814. Etching can include, but is not limited to, BARC layer 1128 being etched for fifty-three seconds and hard mask 1024, which can be a TEOS hard mask, being etched for twenty-two seconds, followed by photoresist strip. Hard mask 1024 can be used to etch etch stop 1022 to etch carbon thin film 1005, forming dielectric etch stop 1222 as a protective region for carbon thin film 1205, resulting from etching carbon thin film 1005. With etch stop 1022 being a nitride, hard mask 1024 can be used for, but is not limited to, etching of etch stop 1022 for one hundred seconds, with a short flash etch, such as but not limited to a 10 second flash of oxygen ($O_2$), to etch carbon thin film 1005, leaving carbon thin film 1205 underneath hard mask 1224 on landing metal 915. The etching can be followed by a clean procedure that can be conducted as a wafer clean-up of etch byproducts.

Figure 13:
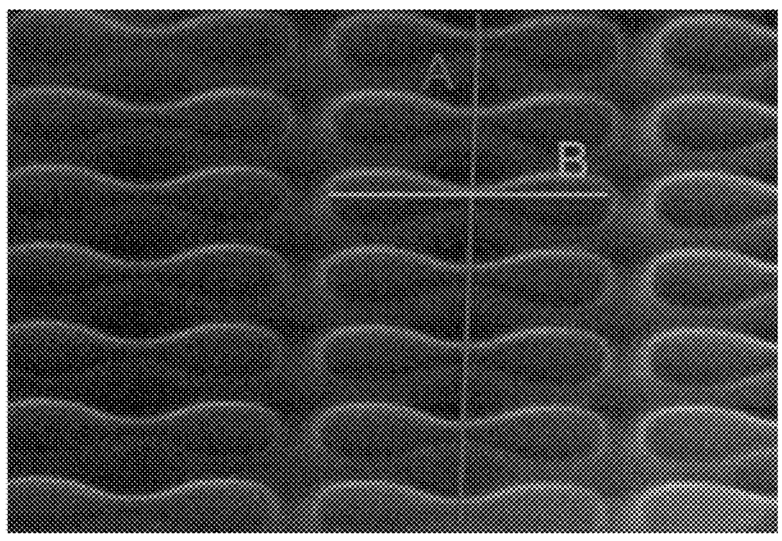
Figure 14:
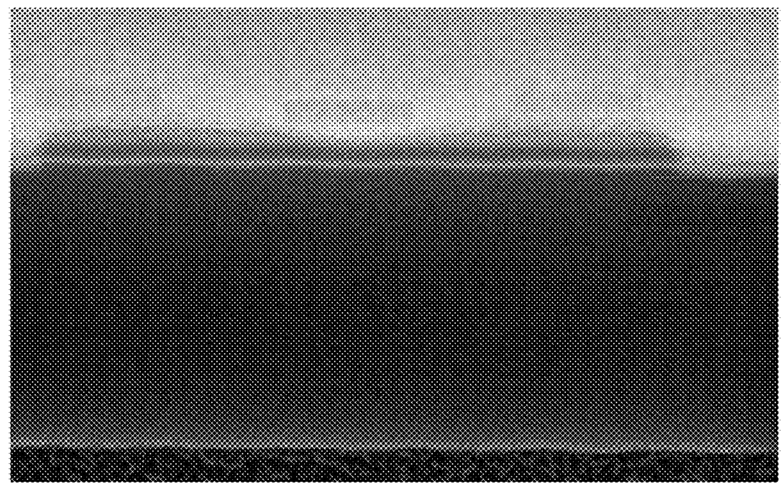
Figure 15:
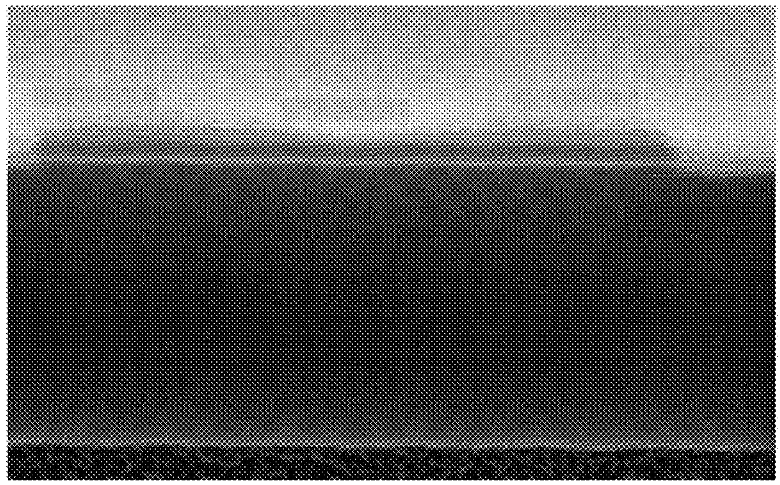

FIG. 13 shows an image of a patterning sequence of multiple carbon thin films 1005 as CNFs. The CNFs have been patterned in a bowtie configuration, with narrow regions of bowtie CNFs being along direction A and directions parallel to direction A. Larger regions of bowtie CNFs are along direction B and directions parallel to direction B. FIGS. 14 and 15 are cross-sectional images of the fabricated CNFs of FIG. 13. The images of FIGS. 14 and 15 indicate that carbon thin films 1005 can be successfully patterned and well protected from over etch or undercut.

Figure 16:
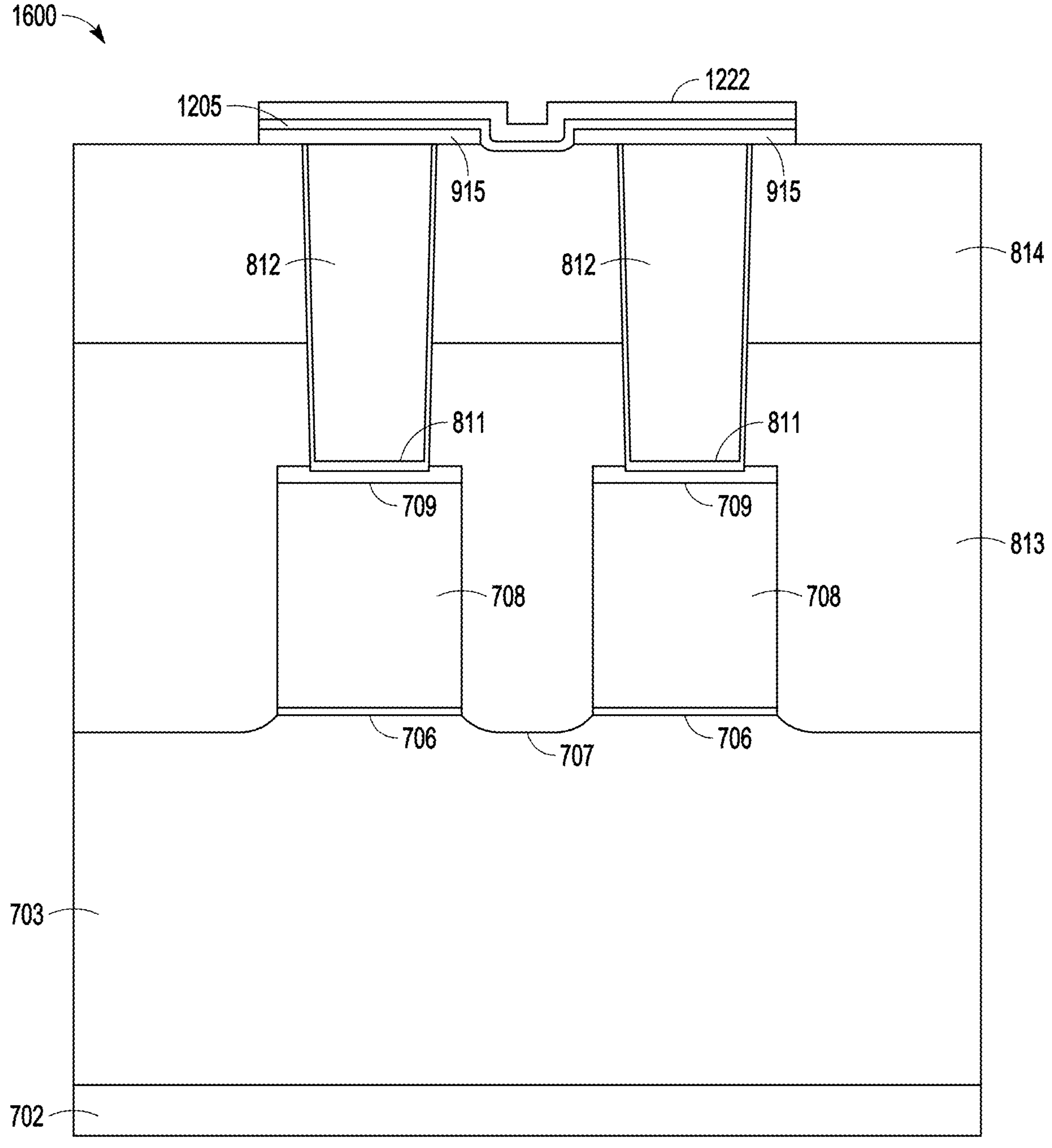

FIG. 16 is a cross-sectional representation of structure 1600 after further processing of structure 1200. Hard mask 1224 has been removed. A short oxide etch can be used to remove hard mask 1224. Exposed dielectric region 814 has been reduced in regions around the stack of landing metal 915, carbon thin film 1205, and etch stop 1222.

Figure 17:
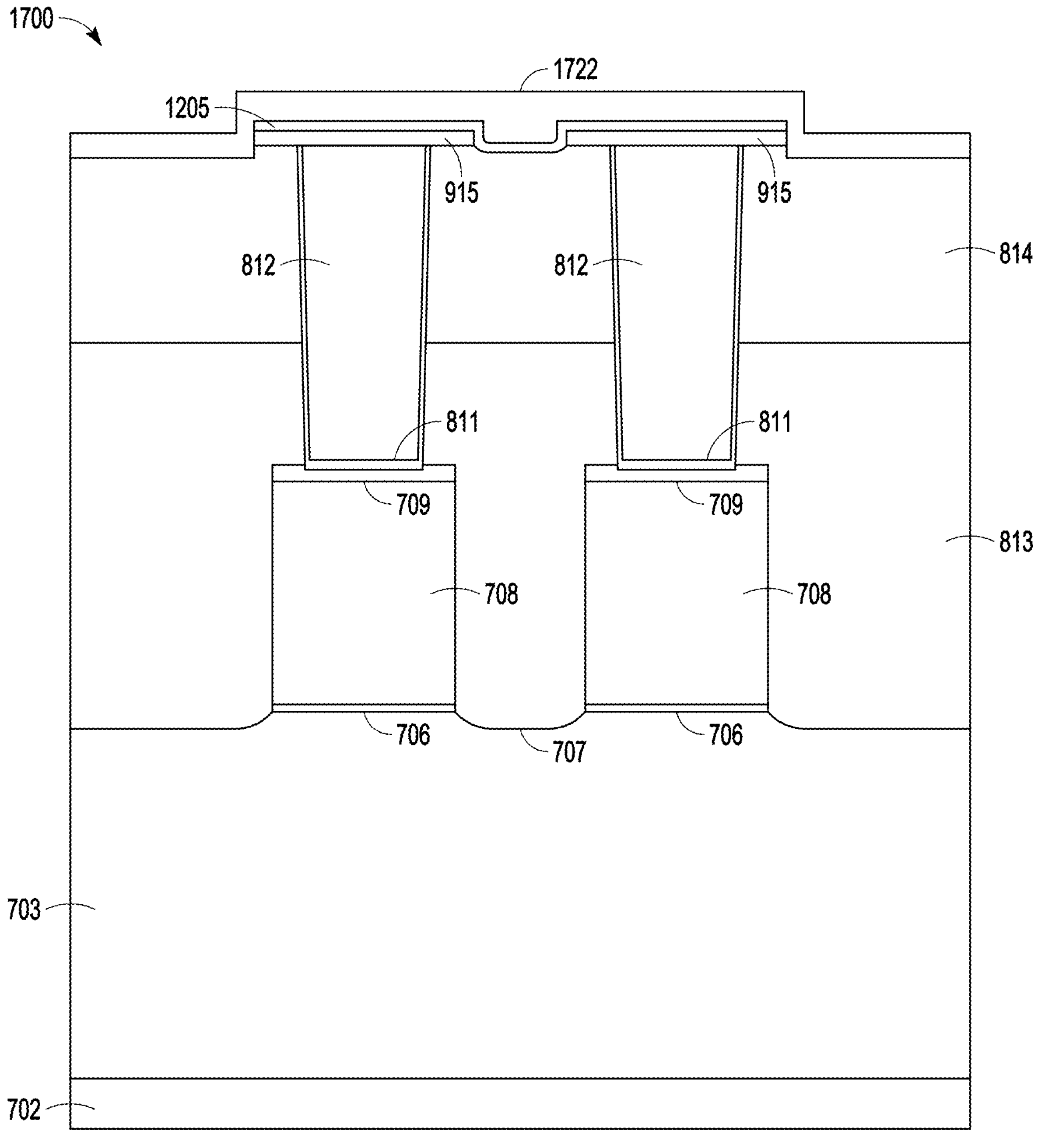

FIG. 17 is a cross-sectional representation of structure 1700 after further processing of structure 1600. Spacer material having the composition of etch stop 1222 has been formed on etch stop 1222 and on a top surface of exposed dielectric region 814, forming spacer material 1722. Spacer material 1722 includes etch stop 1222. Alternatively, spacer material can be a different material from etch stop 1222. Spacer material 1722 can be deposited to act as spacer and protect carbon sidewalls from undercut during photoresist strip in consequent mask levels. Spacer material 1722 can be PVD silicon nitride and can have, but is not limited to, a vertical thickness of approximately 200 Å.

Figure 18:
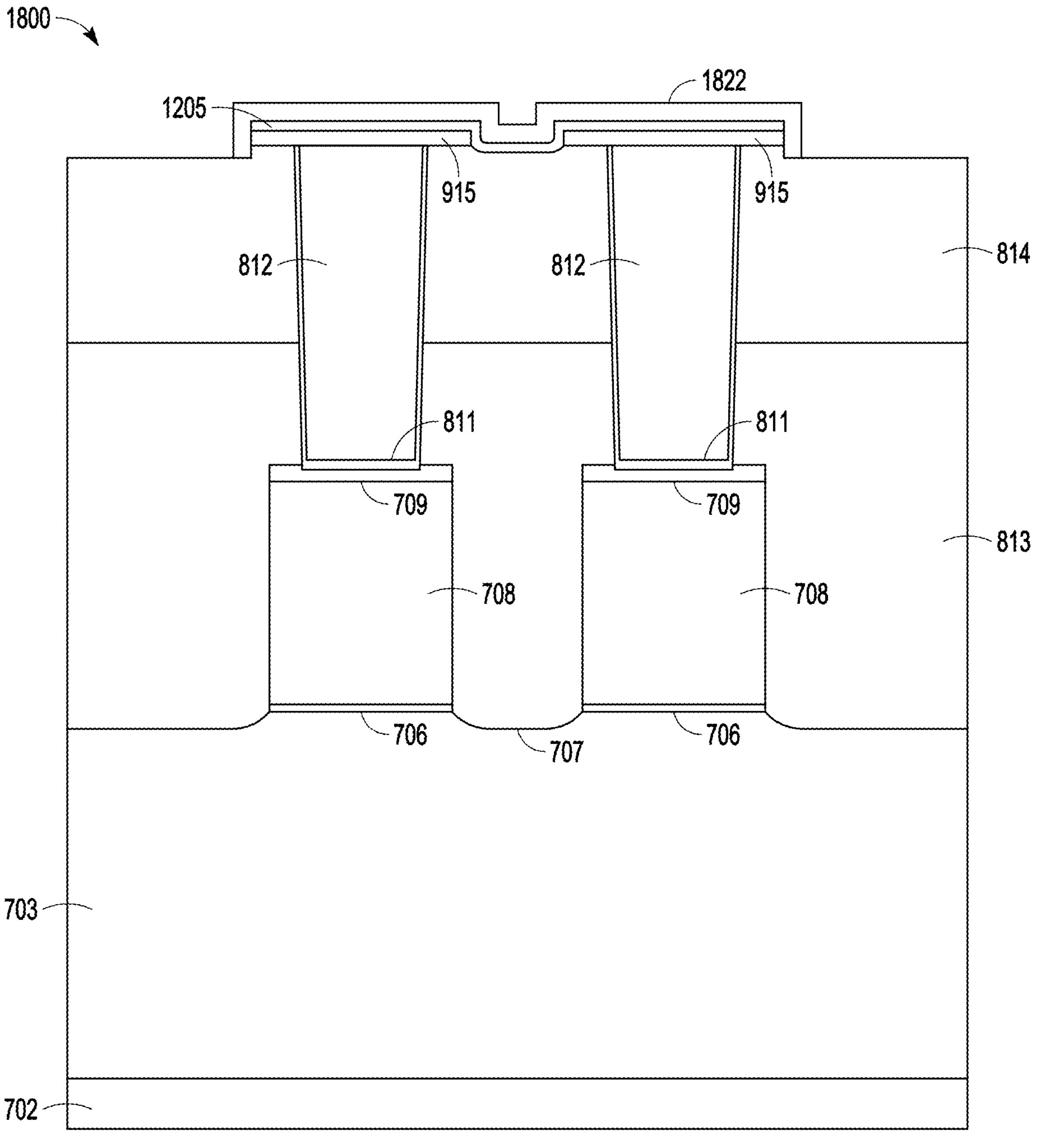

FIG. 18 is a cross-sectional representation of structure 1800 after further processing of structure 1700. Spacer material 1722 has been etched back, forming a spacer 1822. The etching of spacer material 1722 can be conducted with a timed etch, to thin down spacer material 1722 to spacer 1822 on top of carbon thin film 1205, and seal the sidewalls of the stack of landing metal 915, carbon thin film 1205, and etch stop 1222 above a portion of dielectric region 814. This spacer etch leaves spacers on both sides of carbon thin film 1205, formed as a CNF, which protects carbon thin film 1205 from attacks in any further processing.

Figure 19:
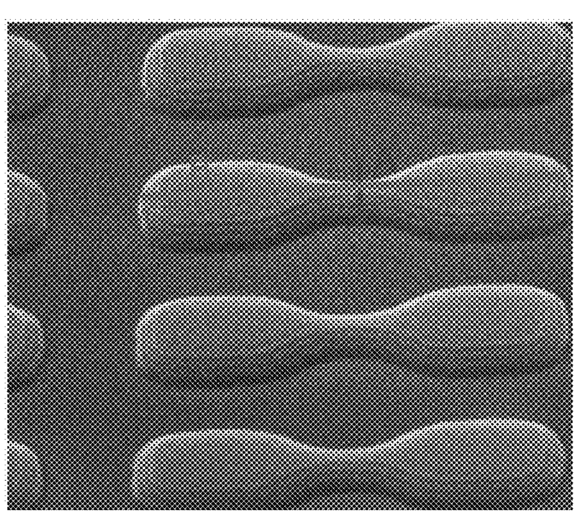
Figure 20:
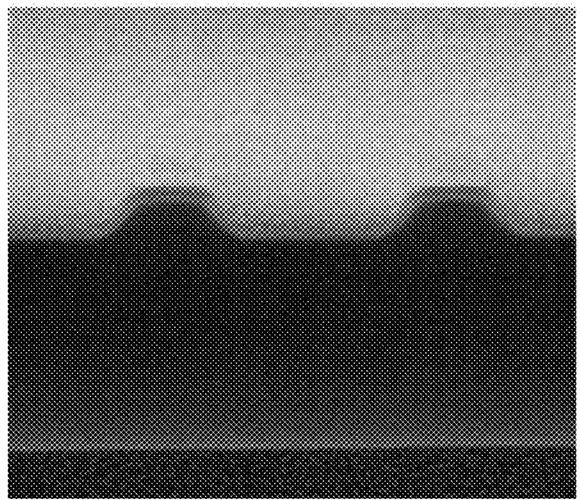
Figure 21:
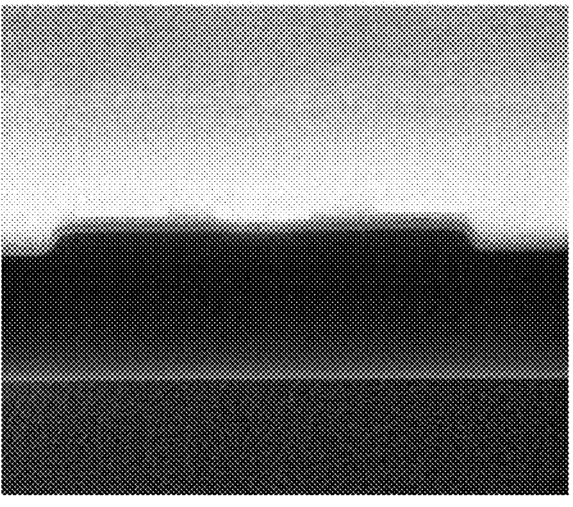

FIG. 19 shows an image of a patterning sequence of multiple carbon thin films 1205 as CNFs. The CNFs have been patterned in a bowtie configuration, with narrow regions of bowtie CNFs being along direction A and directions parallel to direction A. Larger regions of bowtie CNFs are along direction B and directions parallel to direction B. FIGS. 20 and 21 are cross-sectional images of the fabricated CNFs of FIG. 13 after nitride spacer etch.

Figures 22, 23:
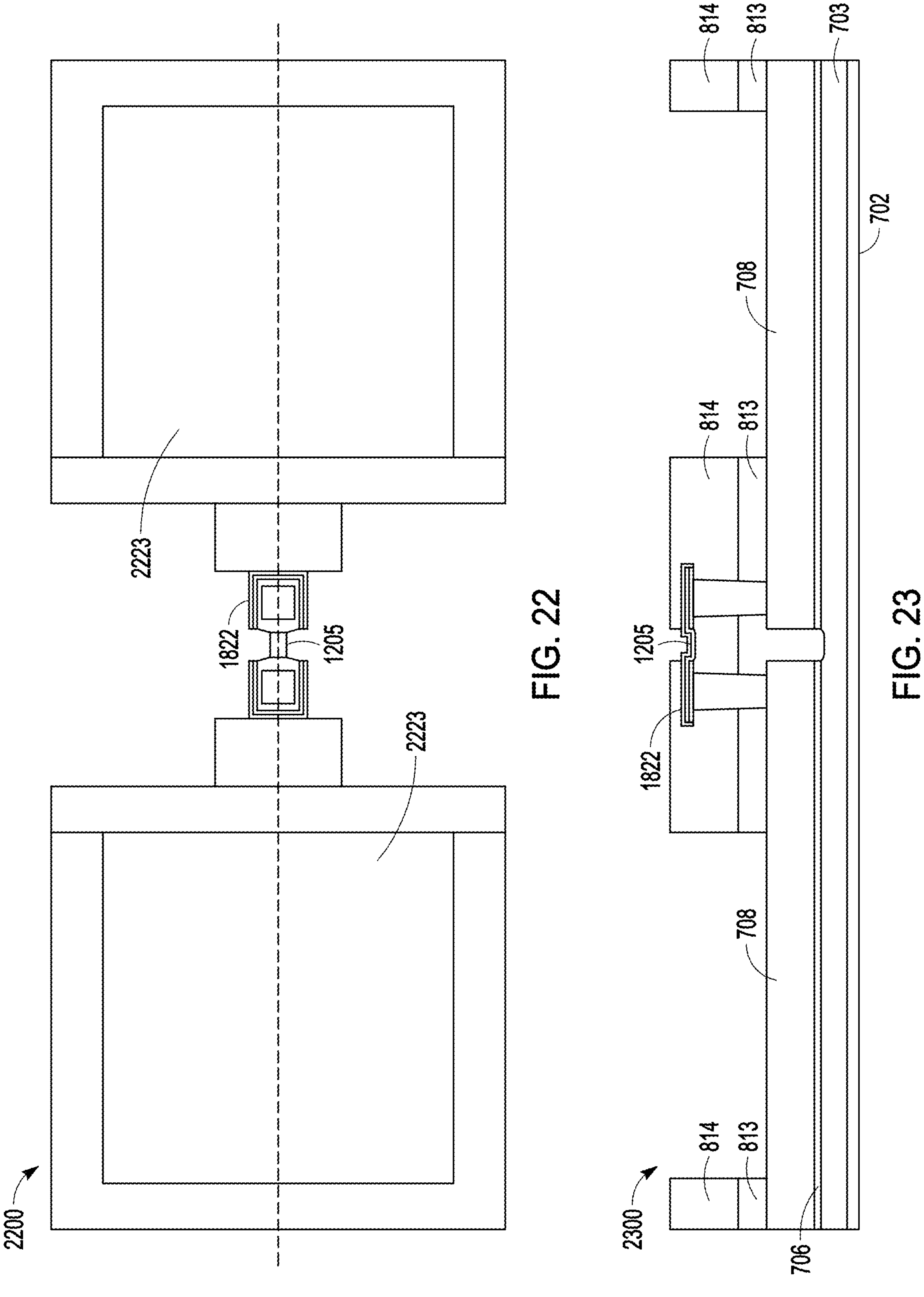
Figure 24:
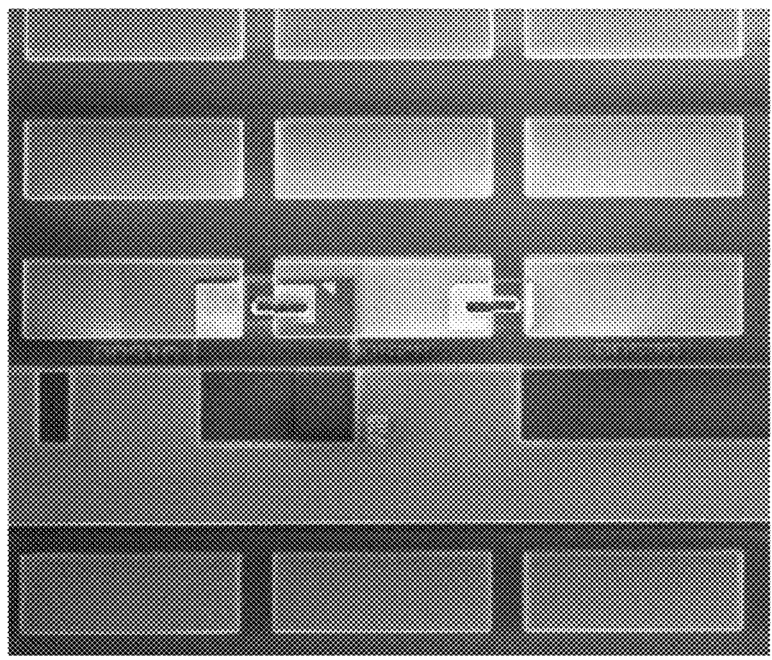

FIG. 22 is a top-down view of structure 2200 after further processing of structure 1800. A pad mask was developed, pads were opened, and the pad mask was striped. Bonding pad openings 2223 were patterned and etched over the metal pads, which can connect to CNF 1205 either directly or through CMOS circuitry. FIG. 23 shows a cross-sectional view of structure 2300 after pad module processing. FIG. 24 shows an image of a top-down view of multiple fabricated pad structures.

Figure 25:
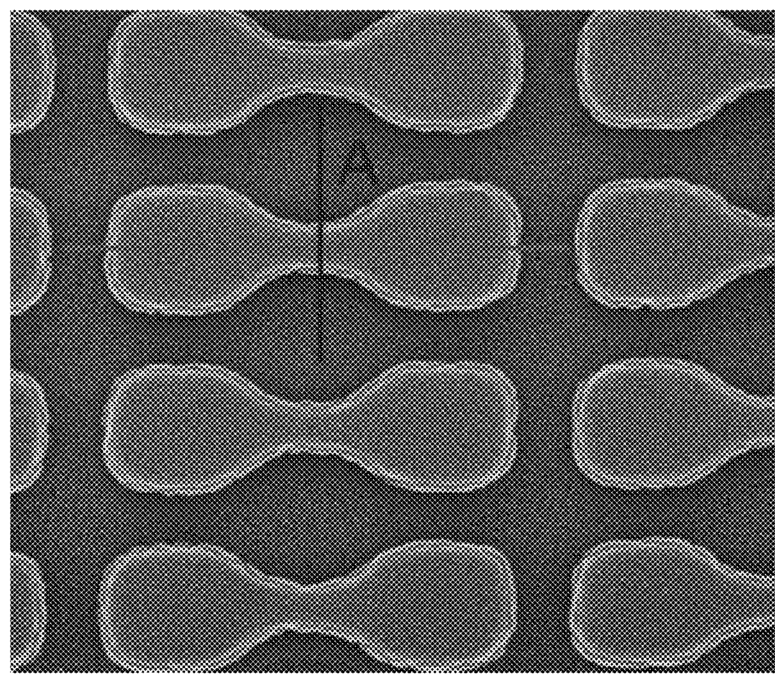
Figure 26:
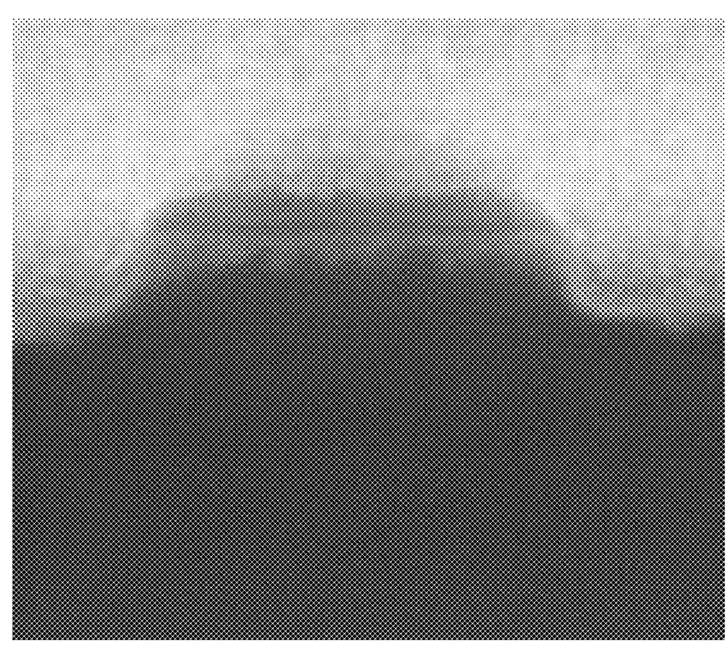
Figure 27:
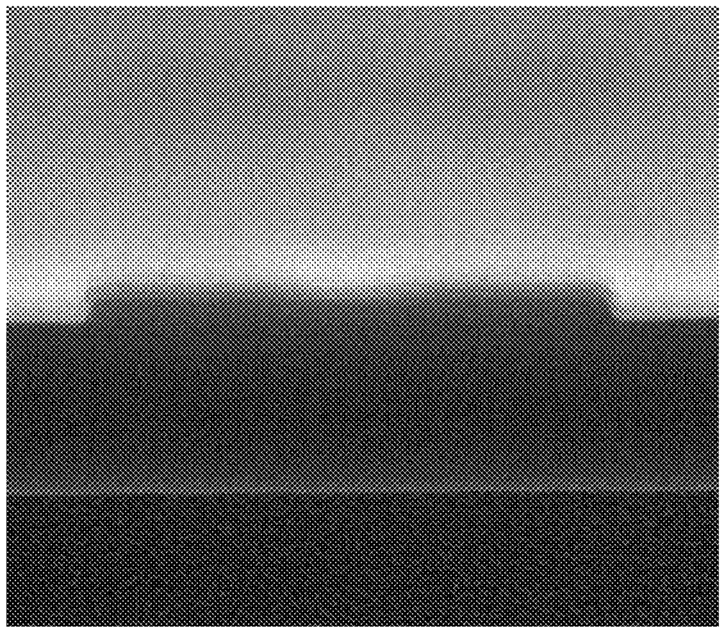

FIG. 25 shows an image of a top-down section of carbon fuse structures after pad module processing. The CNFs have been patterned in a bowtie configuration, with narrow regions of bowtie CNFs being along direction A and directions parallel to direction A. Larger regions of bowtie CNFs are along direction B and directions parallel to direction B. FIGS. 26 and 27 are cross-sectional images of the fabricated CNFs after pad module processing. The images of FIGS. 25-27 indicate that the carbon film stays well protected in the CNF structures. The carbon thin films can be processed to form resistors in an electronic device. The processing associated with FIGS. 7-27 can also be integrated at other points in the process flow of an electronic device, or prior to metal depositions.

In the CNF processing above, a carbon nano-film can be integrated within a CMOS flow, which can include conventional semiconductor processing methods in the flow. The carbon nano-film can be sputtered, which provides a better film uniformity than an evaporation method like ARC-evaporated deposition. In addition, annealing of the carbon nano-film can adjust the sheet resistance into an operable range for the carbon nano-film as a CNF for memory use. This carbon nano-film can be used in configurations alternative to CNFs. The fabrication of carbon nano-film can be integrated in any layer of a CMOS BEOL and such a carbon nano-film can be used as a high-value resistor or a buried fuse. Low temperature processing such as sputtering of carbon films can provide an amorphous carbon film, which can be used as a gate of a MOS transistor with possible improvements over its breakdown voltage. Such carbon processing can also be used as a trimmable element in analog designs.

The carbon processing, as taught herein, can provide a significant improvement over conventional carbon processing. PVD sputtering of a carbon thin film can provide enhanced characteristics, such as resistance and film uniformity. The patterning and etching of the carbon film can include use of a hard mask to protect the carbon film material during initial resist strip sequence. Integration of the carbon thin film structure in CMOS technology with aluminum metals and tungsten vias can be implemented. Carbon nano-films can be patterned and etched using a photoresist mask as opposed to using a lift-off process. The carbon processing, as taught herein, can provide sealing and protecting of the carbon thin film, such as a CNF fuse structure, as opposed to exposing the carbon thin films to the atmosphere or other reactants of electronic device processing.

Forming carbon nano-films, as taught herein, can be integrated in multiple ways. Such a procedure integrated with memory cells can be designed on top of FEOL processing that allows for production of permanent data storage devices. The permanent data storage can be realized by nano-carbon fuse structures. Such a procedure can also be utilized as a high-resistance resistor in a 90 nm processing technology with over 10 Kohm/sq sheet resistance, which can help to minimize chip sizes whenever the specifications include large resistance resistors that are typically implemented with polysilicon resistor of less than 2 Kohm per square. Forming carbon nano-films, as taught herein, is CMOS technology-agnostic, in that it can be implemented in multiple technologies with minor perturbation to existing process flows of these multiple technologies.

As noted herein, improvements can be realized by implementing procedures for forming carbon nano-films as taught herein. These improvements can be illustrated in use of a photoresist mask to pattern and etch the carbon thin-film and in use of a hard mask, which can be an oxide hard mask, to protect the carbon film during etching in the various procedures. These improvements can be illustrated in the use of a nitride spacer to protect the carbon thin-film during subsequent processing. These improvements can be illustrated in integration of a carbon fuse or a carbon resistor structure in any BEOL layer of CMOS technology. Improvements can be realized by a carbon fuse blowing method being an oxidation, which can significantly reduce the likelihood of fuse reconnection, unlike polysilicon fuses.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method of forming an electronic device, the method comprising:

sputtering a carbon film on a surface above a level of circuitry after forming the circuitry and vias between the surface and the level of circuitry;

forming a hard mask above the carbon film;

etching the carbon film using the hard mask to form a fuse pattern for the carbon film; and sealing the etched carbon film after forming the etched carbon film as a fuse, wherein the method includes annealing the sputtered carbon film at a temperature and for a time until resistance of the carbon film is within a specified range of resistance values.

2. The method of claim 1, wherein the method includes performing the sputtering at temperatures substantially lower than processing temperatures used in forming circuitry to which the carbon film is coupled.

3. A method of forming an electronic device, the method comprising:

sputtering a carbon film on a surface above a level of circuitry after forming the circuitry and vias between the surface and the level of circuitry;

forming a hard mask above the carbon film, including forming an etch stop on the carbon film on which the hard mask is formed;

etching the carbon film using the hard mask to form a fuse pattern for the carbon film; and sealing the etched carbon film after forming the etched carbon film as a fuse, wherein forming the etch stop includes depositing a silicon nitride and forming the hard mask includes forming an oxide.

4. The method of claim 1, wherein the method includes forming an etch stop on the carbon film on which the hard mask is formed.

5. The method of claim 3, wherein the method includes forming a dielectric on the carbon film as a protective layer in forming the sealed carbon structure and maintaining portions of the dielectric on the carbon film in the electronic device in completed format.

6. A method of forming an electronic device, the method comprising:

sputtering a carbon film on a surface above a level of circuitry after forming the circuitry and vias between the surface and the level of circuitry, including sputtering the carbon film on a conductive landing formed on two vias of the vias formed between the surface from the level of circuitry;

forming a hard mask above the carbon film;

etching the carbon film using the hard mask to form a fuse pattern for the carbon film; and sealing the etched carbon film after forming the etched carbon film as a fuse.

7. The method of claim 6, wherein the conductive landing includes titanium nitride or titanium nitride and the two vias include tungsten.

8. The method of claim 6, wherein etching the carbon film using the hard mask includes forming a patterned photoresist above the hard mask and etching the hard mask.

9. The method of claim 8, wherein forming the patterned photoresist above the hard mask includes:

forming a bottom anti-reflective coating on and contacting the hard mask;

spinning the photoresist on the bottom anti-reflective coating, forming spun-on photoresist;

subjecting the spun-on photoresist to a heat treatment to bake the photoresist; and developing the photoresist.

10. The method of claim 6, wherein scaling the etched carbon film includes forming a dielectric spacer along a vertical side of the etched carbon film.

11. The method of claim 6, wherein the method includes forming the hard mask to a thickness correlated to thickness of the sputtered carbon film.

12. A method of forming an electronic device, the method comprising:

sputtering a carbon film on a surface above a level of circuitry after forming the circuitry and vias between the surface and the level of circuitry;

forming a hard mask above the carbon film;

etching the carbon film using the hard mask to form a fuse pattern for the carbon film; and sealing the etched carbon film after forming the etched carbon film as a fuse, wherein etching the carbon film using the hard mask to form a fuse pattern includes forming a pattern of array of fuses, with each fuse contacting two vias between the surface from the level of circuitry.

13. The method of claim 12, wherein the method includes structuring the circuitry with components to operate the fuse as a permanent data component.

14. A method of forming a write-once-read-many memory device, the method comprising:

forming circuitry to control an array of memory cells;

forming access transistors to couple to the circuitry;

forming access lines to couple between the circuitry and the access transistors forming data lines; and forming carbon fuses as data storage components of the memory cells, each carbon fuse formed by:

depositing, by physical vapor deposition, a carbon film on a surface of a layer above a level of the circuitry, access transistors, access lines, and data lines after forming vias between the surface and the level of the circuitry, access transistors, access lines, and data lines;

forming a hard mask above the carbon film;

etching the carbon film using the hard mask to form a fuse pattern for the carbon film; and sealing the etched carbon film after forming the etched carbon film as a fuse.

15. The method of claim 14, wherein depositing the carbon film by physical vapor deposition includes sputtering the carbon film.

16. The method of claim 15, wherein the method includes forming an etch stop on the carbon film on which the hard mask is formed.

17. The method of claim 15, wherein the method includes sputtering the carbon film on a conductive landing formed on two vias of the vias formed between the surface from the level of circuitry.

* * * * *